US007278121B2

(12) United States Patent
Aitnouri et al.

(10) Patent No.: US 7,278,121 B2
(45) Date of Patent: Oct. 2, 2007

(54) METHOD AND APPARATUS FOR REDUCING REDUNDANT DATA IN A LAYOUT DATA STRUCTURE

(75) Inventors: Elmehdi Aitnouri, Nepean (CA); Edward Keyes, Ottawa (CA); Stephen Begg, Ottawa (CA); Val Gont, Kanata (CA); Dale McIntyre, Carleton Place (CA); Mohammed Ouali, Ottawa (CA); Vyacheslav Zavadsky, Ottawa (CA)

(73) Assignee: Semiconductor Insights Inc., Ontario (CA)

( * ) Notice: Subject to any disclaimer, the term of this patent is extended or adjusted under 35 U.S.C. 154(b) by 174 days.

(21) Appl. No.: 10/922,982

(22) Filed: Aug. 23, 2004

(65) Prior Publication Data

US 2006/0041849 A1    Feb. 23, 2006

(51) Int. Cl.
*G06F 17/50* (2006.01)
(52) U.S. Cl. ............................ 716/2; 716/12; 716/13; 716/14
(58) Field of Classification Search .................... 716/2, 716/12–14
See application file for complete search history.

(56) References Cited

U.S. PATENT DOCUMENTS

| 5,587,919 | A | * | 12/1996 | Cheng et al. ................... 716/2 |
| 6,091,426 | A | | 7/2000 | Hauck et al. |
| 6,463,576 | B1 | * | 10/2002 | Tomoda ....................... 716/17 |
| 6,525,722 | B1 | | 2/2003 | Deering |
| 6,532,581 | B1 | * | 3/2003 | Toyonaga et al. ............. 716/11 |
| 6,594,801 | B1 | | 7/2003 | Dishon et al. |
| 6,742,165 | B2 | * | 5/2004 | Lev et al. ...................... 716/1 |
| 6,779,158 | B2 | * | 8/2004 | Whitaker et al. .............. 716/3 |
| 6,985,847 | B2 | * | 1/2006 | Burdorf et al. ............... 703/22 |
| 2002/0166104 | A1 | * | 11/2002 | Wu et al. ..................... 716/12 |
| 2003/0188271 | A1 | * | 10/2003 | Zhuang et al. ................ 716/2 |

OTHER PUBLICATIONS

Schroeder et al., "Decimation of Triangle Meshes," General Electric Company, Schenectady, NY. 1992.

* cited by examiner

*Primary Examiner*—Jack Chiang
*Assistant Examiner*—Magid Y. Dimyan
(74) *Attorney, Agent, or Firm*—Price, Heneveld, Cooper, DeWitt & Litton, LLP (57) ABSTRACT

The method and apparatus in accordance with the present invention reduces the data size of a layout data structure by reducing the amount of electrically redundant interconnects within a bank of interconnects. Electrically redundant interconnects are the repetitive interconnects within a bank of interconnects which do not contribute to the understanding of the IC. Therefore, a number of these interconnects may be deleted from the banks in the layout data structure, provided that enough interconnects remain to maintain the electrical connectivity and the visual representation of the bank.

39 Claims, 5 Drawing Sheets

Interleaved Representation  55  (8 bits)

Figure 6

METHOD AND APPARATUS FOR REDUCING REDUNDANT DATA IN A LAYOUT DATA STRUCTURE

FIELD OF INVENTION

The present invention relates generally to a method and apparatus for data compression, and more particularly to a method and apparatus to reduce the size of a layout data structure.

BACKGROUND OF THE INVENTION

There exists a need in the art for a method and apparatus to reduce the data size of exceptionally large layout data structures, particularly in layout applications whereby blocks of circuitry and embedded features within an IC are represented. These layout data structures can potentially take up excessive amounts of memory space within a computer system making them difficult to manipulate. Further, the size of these layout data structures taxes the storage capacity of the computer system.

There are a number of methods in the art to reduce data size. Generally, compression systems work by removing redundant or superfluous data in order to reduce the amount of data to be compressed. These systems often trade functionality and quality for higher compression ratios. Further, compression systems in general require significant computing power.

U.S. Pat. No. 6,594,801, which issued to Dishon et al on Jul. 15, 2004, provides a method for compressing a data structure representing a layout of a multi layered VLSI device. The method comprises the steps of generating a non-functional elements locating data structure representing all the non-functional elements of all layers within the layout; deleting representations of non-functional elements from the data structure and adding the compressed non functional elements data structure to generate a compressed data structure representing the layout. While this technique does reduce the size of the layout data structure, it is a complex process requiring intensive computer power.

Therefore there is a need for a method and apparatus for reducing the size of a layout data structure without significantly impacting the quality or functionality of the layout data, and without the need for complex and computationally intensive operations.

SUMMARY OF THE INVENTION

The present invention is directed to a method and apparatus for reducing the data size of a layout data structure, by reducing the amount of electrically redundant interconnects within a bank of interconnects. These interconnect banks represent a unique signal within the layout. Electrically redundant interconnects are the repetitive interconnects within a bank of interconnects which do not contribute to the understanding of the IC. Therefore, a quantity of these interconnects may be deleted from the bank, provided that enough interconnects remain to maintain the electrical connectivity and the visual representation of a bank of interconnects.

In accordance with one aspect of the invention, the data in a layout data structure is reduced by identifying interconnects within the layout, detecting banks of the interconnects, identifying selected interconnects located within the banks in accordance with a predetermined criteria and deleting the identified selected interconnects from the layout data structure.

In accordance with another aspect of the invention, data in a layout data structure is reduced by assigning a unique address location to each interconnect within the layout file, detecting a bank of interconnects within the layout data structure using the unique addresses and replacing all the interconnects within the detected bank with a single large interconnect.

In accordance with a further aspect of this invention, the data in a layout data structure, having interconnects identified by coordinates in the layout file is reduced by assigning a unique address location to each interconnect within the layout data structure, using the unique addresses to detect banks of interconnects within the layout data structure, selecting locations within each bank where an interconnect will be flagged, sequentially identifying the location of each interconnect in the layout file, flagging the interconnects located in the predetermined locations and deleting the flagged interconnects from the layout data structure.

In accordance with another aspect of the invention, the data in a layout data structure is reduced by assigning a unique address location to each interconnect within the layout data structure, detecting a bank of interconnects within the layout data structure using the unique addresses, deleting a plurality of the interconnects from the detected bank, leaving sufficient interconnects to maintain electrical connectivity and visual representation of said bank of interconnects.

In accordance with a specific aspect of the invention, the unique address comprises bitwise interleaved x and y coordinates of the interconnect location in the layout.

In accordance with a further specific aspect of the invention, a bank of interconnects comprises the interconnects having a neighbouring interconnect located within a predetermined distance.

In accordance with another aspect of the invention, interconnects that are selected for deletion may include the interconnects that border the outer edge of a bank, the interconnects that have interconnects on all sides, and/or the interconnects that are located in predetermined horizontal, vertical and/or diagonal rows in the bank.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein.

DETAILED DESCRIPTION

For purposes of explanation, specific embodiments are set forth to provide a thorough understanding of the present invention. However, it will be understood by one skilled in the art, from reading this disclosure, that the invention may be practiced without these specific details. Moreover, well-known elements, devices, process steps and the like are not set forth in detail in order to avoid obscuring the scope of the invention described.

In a high magnification layout system useful in representing electronic circuits and embedded features of an IC for example, the present invention provides a method to reduce the occurrence of redundant data within a layout data structure. In accordance with the present invention, this redundant data is found in the banks of repetitive structures such as interconnections, also referred to as vias or contacts, whereby multiple interconnects are contained within a small area and conduct the same electrical signal. These multiple interconnects use up valuable space within the layout data structure.

The present invention reduces the data size by reducing the amount of electrically redundant interconnects within a bank of interconnects. Some of the interconnects within a bank do not contribute to the understanding of the IC. Therefore, a quantity of these interconnects may be deleted from the layout data of the bank, provided that enough interconnects remain to maintain the electrical conductivity and the visual representation of the bank. Data size reduction is particularly useful in applications such as, design emulation, circuit extraction, and in circuit layout design where only the visual representation of the data is needed.

Figure 1:
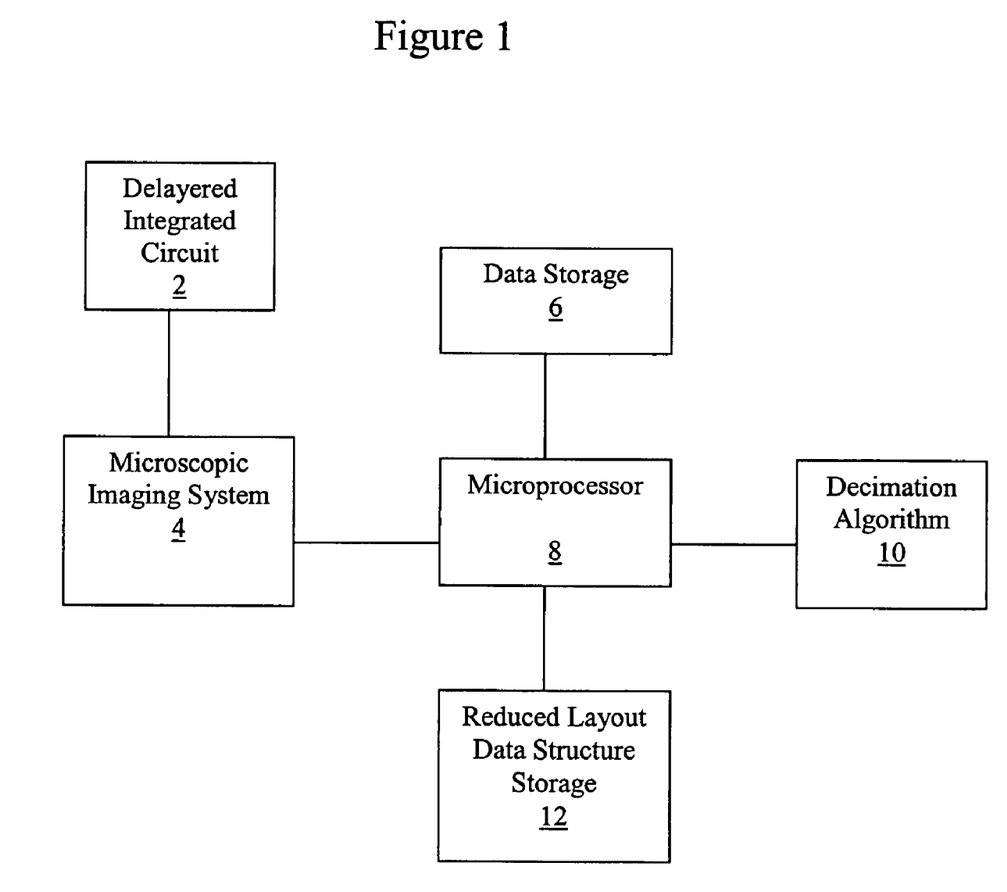
FIG. 1 is a schematic diagram of the apparatus in accordance with the present invention.

The method of the present invention may be implemented by the apparatus illustrated in the block diagram of FIG. 1. The images of a delayered IC 2 may be captured by a microscopic imaging system 4, such as a scanning electron microscope (SEM) or some other such device, and stored in a data storage memory 6, which is coupled to a processor 8. The images generated by the microscopic imaging system 4 are electronically stitched together to form grids of the mosaicked images. Pattern recognition is then performed on the images to generate the layout data structure, which is then aligned to ensure that the layers correspond correctly to each other. The aligned layout is stored in memory 6 with the original image files. A decimation algorithm 10 is applied to the layout data structure from storage 6 to produce a reduced layout data structure having a reduced amount of data. The reduced layout data structure is stored in data storage 12.

Figure 2:
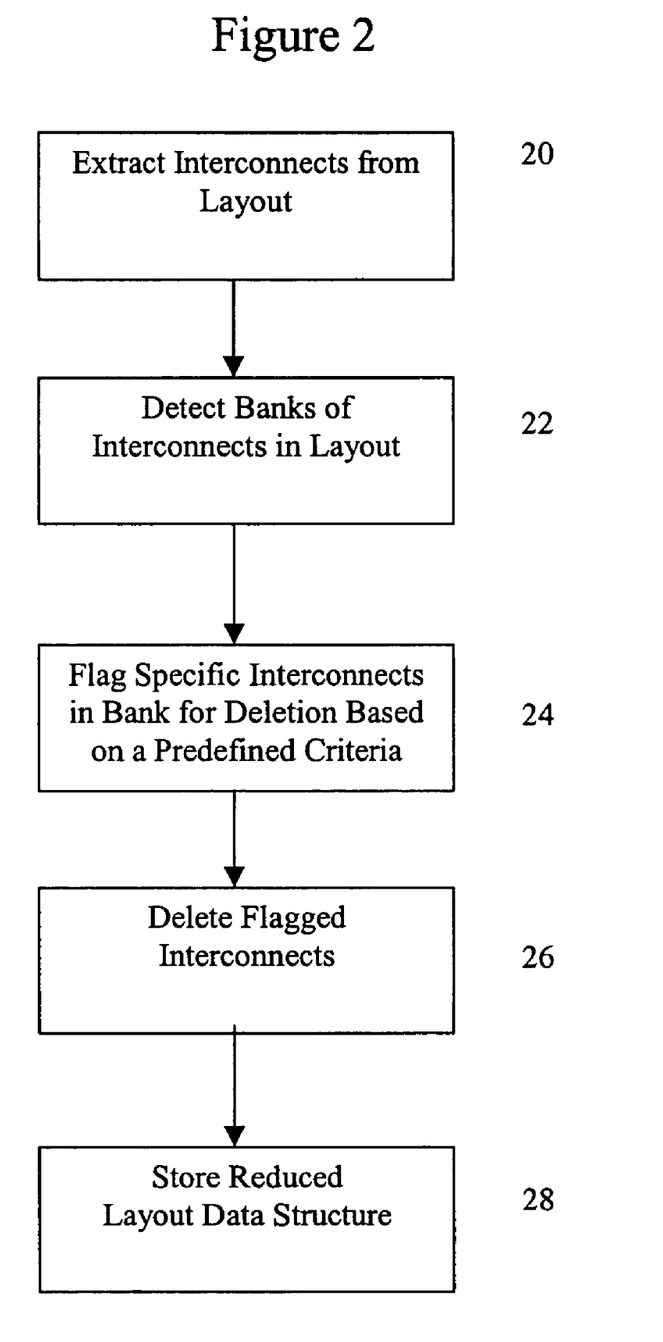
FIG. 2 is a flow chart representation of the present invention.

The basic method in accordance with the present invention is illustrated in the flow chart of FIG. 2. Interconnects are extracted 20 from the layout data structure stored in data storage 6 and banks of interconnects are detected 22. Specific interconnects are then flagged 24 for deletion based on a predetermined criteria as provided by the decimation algorithm. These flagged interconnects are then deleted 26 from the layout data structure, resulting in a significant reduction in data size. The reduced data files for the banks of interconnects are then stored 28 in data storage 12.

Various criteria may be established for the decimation algorithm to determine which of the interconnects may be eliminated while maintaining the electrical connectivity as well as the visual representation of a bank of interconnects. Some of these criteria are demonstrated by FIGS. 3a to 3d.

Figure 3A:
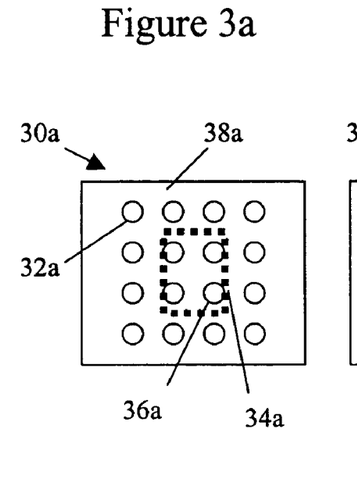
FIGS. 3a to 3d are schematic representations of interconnect banks and demonstrate criteria for eliminating interconnects in a layout data structure.
Figure 3B:
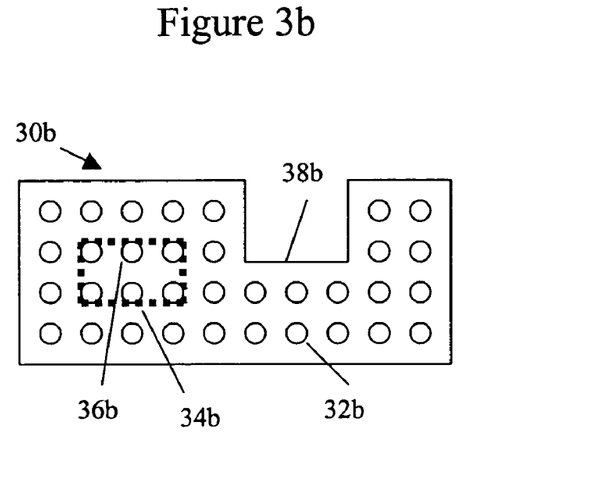

FIGS. 3a and 3b are graphical representations of 2 differently shaped interconnect banks 30a and 30b. For purposes of explanation, the interconnects, which border the edge of the bank 30a and 30b are designated as interconnects 32a and 32b respectively whereas the interconnects, which are completely surrounded by neighbouring interconnects and are shown as being contained within the thick dotted lines 34a and 34b respectively, are designated as interconnects 36a and 36b respectively. The lines 38a and 38b represent the edges of the interconnect banks 30a and 30b respectively. In these particular examples, the criteria being applied for determining which interconnects are to be eliminated is whether or not an interconnect is completely surrounded by neighbouring interconnects. In FIGS. 3a and 3b, interconnects 36a and 36b are completely surrounded by other interconnects, therefore the criteria established may be that interconnects 36a and 36b are to be deleted from the banks 3a and 3b, leaving interconnects 32a and 32b. Alternately, interconnects 32a and 32b may be deleted leaving interconnects 34a and 34b in the banks. Therefore, in the method described in conjunction with FIG. 2, the predetermined criteria for step 24 would be that either interconnects 34a and 34b are to be flagged for deletion or that interconnects 32a and 32b are flagged for deletion. As can be seen, by reducing the number of interconnects populating each bank 30a, 30b, the layout data structure size will be significantly reduced while the functionality of the bank of interconnections is maintained.

Figure 3C:
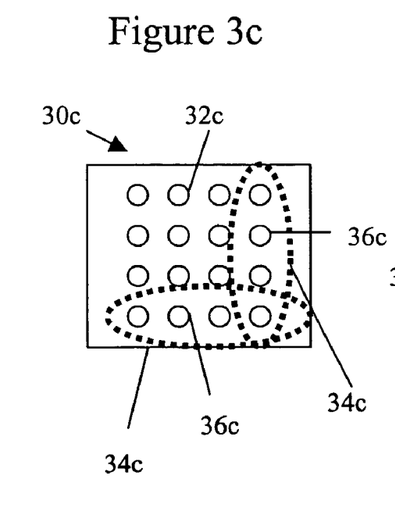
Figure 3D:
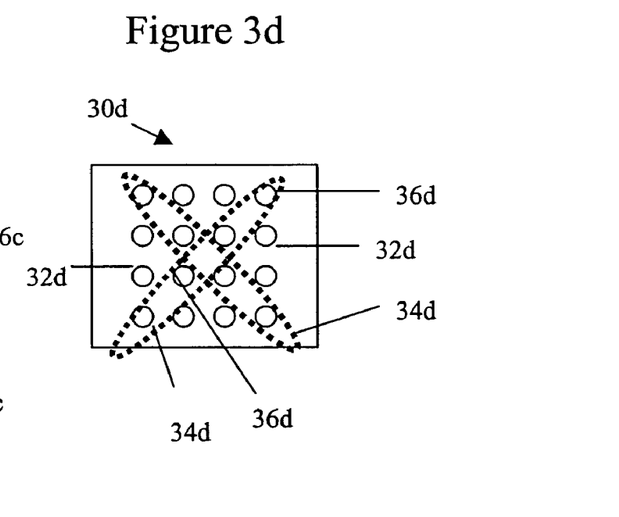

Other alternative criteria in accordance with the present invention are demonstrated in FIGS. 3c and 3d. In the case of FIG. 3c, it may be determined that in the bank 30c, the interconnects 36c in certain rows encircled by lines 34c are to be flagged for deletion leaving interconnects 32c. Alternately, interconnects 32c may be flagged for deletion, leaving interconnects 36c. The example demonstrated in FIG. 3d is similar to that described with respect to FIG. 3c except that the interconnects 36d enclosed by lines 34d represent diagonal rows rather than vertical and horizontal rows. In this example, it may be determined that in the bank 30d, the interconnects 36d in certain diagonal rows encircled by lines 34d are to be flagged for deletion leaving interconnects 32d, or alternately, interconnects 32d may be flagged for deletion, leaving interconnects 36d. In these examples, the interconnects are deleted in such a way that sufficient interconnects remain to maintain the electrical connectivity and visual representation of the bank. It should be quite clear from the above criteria examples that there are numerous ways of setting criteria to reduce the quantity of interconnects within a layout data structure in such a way that the remaining interconnects maintain the electrical connectivity as well as the visual representation of the bank.

In still another example of criteria in accordance with the present invention, the interconnect location information may be used to identify the corners of an interconnect bank. With this information, all the interconnects within the bank may be replaced by a single large interconnect created to represent the entire bank. This large interconnect would substantially cover the entire area of the original interconnect bank, but require much less data to describe its location.

Figure 4:
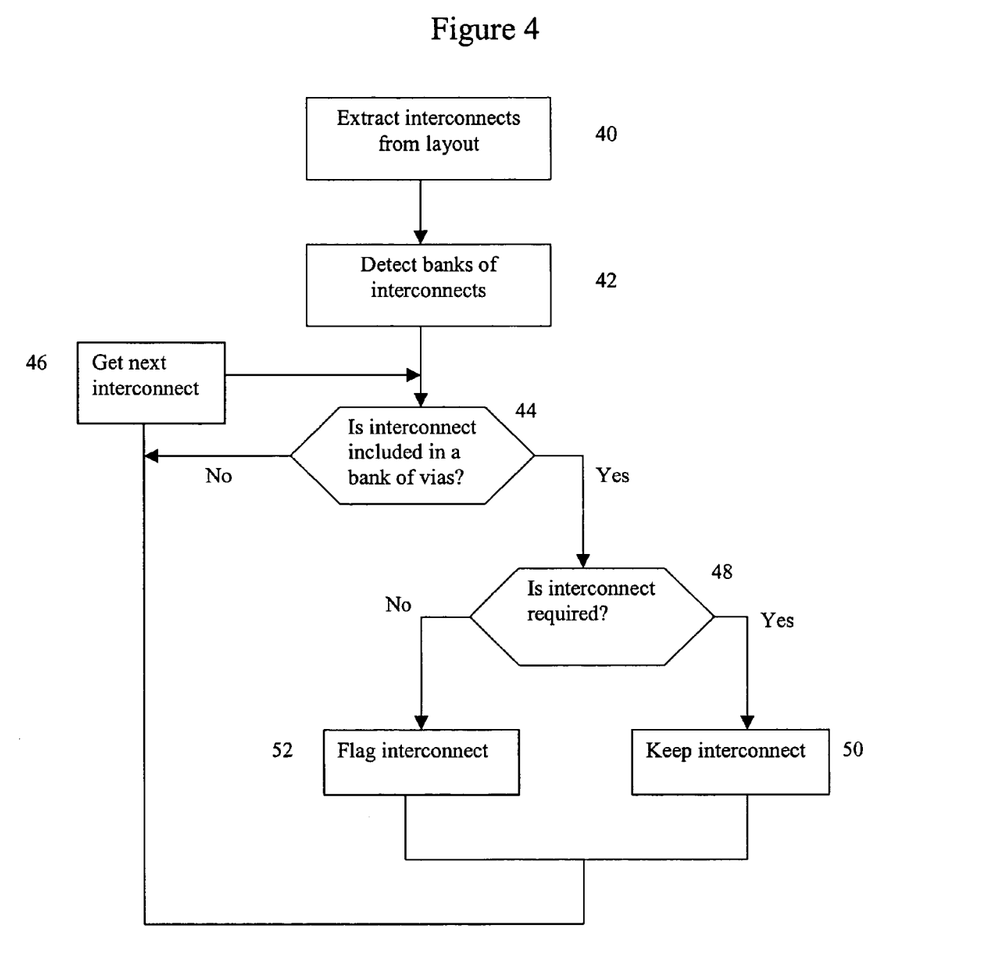
FIG. 4 is a flow chart illustrating the selection of interconnects for retention and for elimination.

A specific embodiment of the method for implementing the present invention is further described in conjunction with the flowchart of FIG. 4. First, the interconnects within the layout are identified 40 and the banks of interconnects detected 42. A query is used to determine 44 if the interconnect of interest is within the bank in question. If not, the next interconnect is retrieved 46. However, if the interconnect is within the bank in question, a second query determines 48 if the interconnect is required to maintain the electrical connectivity as well as the visual representation of the bank. If the response to the second query is yes, the interconnect is kept 50 and if the response is no, the interconnect is flagged 52 for deletion. The next interconnect is retrieved 46 and follows the same steps until all interconnects in the bank in question have been processed. As described with regard to FIG. 2, step 26, only the interconnects which have been flagged are then deleted from the layout data structure.

The query in step 48 will depend on the criteria that has been set for keeping or deleting interconnects, for example, the query may be "is the interconnect on the edge of the bank?" as represented by FIGS. 3*a*, 3*b*, "is the interconnect in a predetermined row or column?" as represented by FIG. 3*c*, or again "is the interconnect in a predetermined diagonal row?" as represented by FIG. 4*c*. As described above, there may also be other criteria set, which would determine the form and content of the query.

Figure 5:
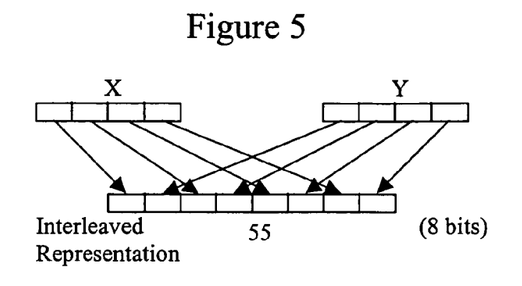
FIG. 5 is a schematic representation of producing a unique interconnect location code by interleaving.
Figure 6:
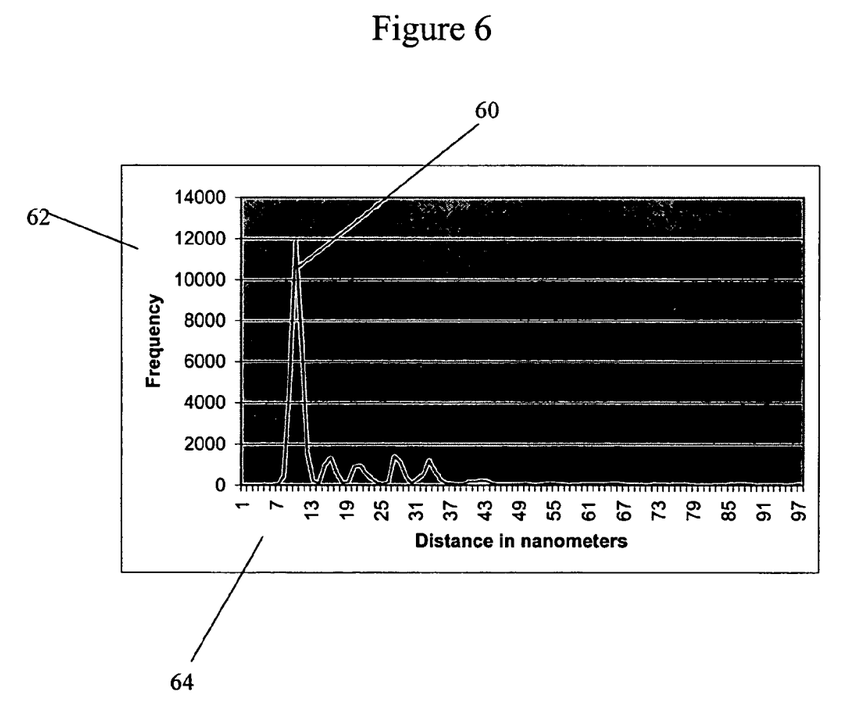
FIG. 6 is a histogram graph of interconnect frequency and distance measurements for determining banks of interconnects.

Various methods may be used to determine the location of interconnects and banks of interconnects. With reference to FIG. 5, it is noted that each interconnect has an x and y coordinate representative of its location within the layout. The coordinates of all interconnects within the layout are stored within memory 6. To simplify the processing of the interconnects, these coordinates are then bitwise interleaved to form a unique number 55 representing the interconnect. This is done by combining the abscissa, the x coordinate X1 and the ordinate, the y coordinate Y1 in the following way: X1: x3x2x1x0 Y1: y3y2y1y0 to give interleaved address: x3y3x2

For simplicity, the interleaving step is represented using an 8-bit interleaved coordinate, however a 64 bit co-ordinate is more likely for our application. In the interconnect extraction 40 and bank detecting 42 process, all interconnect coordinates are interleaved and sorted. This sorting with the unique representation of the coordinates creates definable clusters in the array where blocks of interconnects are located. The distance between two successive interconnects within these clusters is computed and the data is used to create a histogram.

The histogram graph of FIG. 5 represents the frequency at which interconnects are at a particular distance apart from other interconnects. A large peak 60 having a very high frequency 62 defines a bank of interconnects. The maximum frequency 62 in the histogram corresponds to the distance 64 between two interconnects in a bank, i.e.: the areas in which the interconnects are most densely populated would correspond to an interconnect bank, therefore, the distance between these interconnects would represent the maximum distance 64 between successive interconnects within a bank). Further, since the histogram data defines the maximum distance 64 between interconnects for a peak 60 of interconnects, it is possible to avoid confusion with interconnects which are located near to, but not within, a bank.

For a given interconnect, the maximum distance information obtained from the histogram, along with the interleaved interconnect co-ordinates, are passed on to an R-tree query in order to find all neighbouring interconnects. R-Tree queries are described in a paper by Christian Bohm, et al, entitled "Searching in high-dimensional spaces: Index structures for improving the performance of multimedia databases" which is incorporated by reference. It is known by a person skilled in the art that both histograms and R-tree queries are known and understood mathematical concepts and therefore, will not be described in detail. Further, a person skilled in the art should understand that different types of queries might be used without departing from the scope of the invention.

The presence of neighbouring interconnects are identified and used to determine the outside boundaries of a bank, the interconnects within the bank or where within a bank a particular interconnect is located. As described above, this information is then used to determine which interconnects are to be deleted from the bank to reduce data in the layout data structure while at the same time maintaining the electrical connectivity and visual representation of the interconnect bank.

One advantage of the present invention is that it reduces the data size of a layout data structure without the need for excessive computing power.

Another advantage is that it provides a data size reduction without adversely affecting the layout quality or functionality.

While the invention has been described according to what is presently considered to be the most practical and preferred embodiments, it must be understood that the invention is not limited to the disclosed embodiments. Those ordinarily skilled in the art will understand that various modifications and equivalent structures and functions maybe made without departing from the spirit and scope of the invention as defined in the claims. Therefore, the invention as defined in the claims must be accorded the broadest possible interpretation so as to encompass all such modifications and equivalent structures and functions.

What is claimed is:

1. A method of reducing an amount of data in a layout data structure for an integrated circuit (IC) comprising:
   a. identifying interconnects within the layout data structure;
   b. detecting a bank of the interconnects, each interconnect in the bank being commonly electrically connected at an input and an output thereof;
   c. identifying selected interconnects located within the bank in accordance with a predetermined criteria; and
   d. deleting the identified selected interconnects from the layout data structure.

2. The method as claimed in claim 1 wherein the predetermined criteria is determined as a function of the interconnects required to maintain the electrical connectivity of the bank.

3. The method as claimed in claim 1 wherein the predetermined criteria is determined as a function of the interconnects required to maintain the visual representation of the bank.

4. The method as claimed in claim 1 wherein the predetermined criteria is determined as a function of the interconnects required to maintain the electrical connectivity and visual representation of the bank.

5. The method as claimed in claim 1 wherein the location of each interconnect in the layout is identified by x and y coordinates and step a. includes:
   a.1 assigning a unique address location to each interconnect within a layout.

6. The method as claimed in claim 5 wherein step a.1. includes:
   a.2 bitwise interleaving the x and y coordinates to form the unique address locations.

7. The method as claimed in claim 6 wherein step b. includes:
   b.1 sorting the unique address locations to define the bank of interconnects.

8. The method as claimed in claim 7 wherein the bank comprises interconnects having a neighbour interconnect located within a predetermined distance and whereby each interconnect is electrically interconnected.

9. The method as claimed in claim 1 wherein the selected interconnects border an outer edge of the bank.

10. The method as claimed in claim 1 wherein the selected interconnects have interconnects on all sides.

11. The method as claimed in claim 1 wherein the selected interconnects are located in predetermined rows in the bank.

12. The method as claimed in claim 11 wherein the rows in the bank are horizontal, vertical and/or diagonal.

13. The method of reducing the amount of data in a layout data structure comprising the steps of:
   a. assigning a unique address location to a each interconnect within the layout data structure;
   b. detecting a bank of interconnects within the layout data structure using the unique addresses, each interconnect in the bank being commonly electrically connected at an input and an output thereof; and
   c. replacing all the interconnects within the detected bank with a single large interconnect.

14. The method as claimed in claim 13 wherein steps b. and c. are repeated for each interconnect bank in the layout data structure.

15. The method as claimed in claim 14 wherein the unique address location comprises bitwise interleaved x, y coordinates of an interconnect.

16. The method as claimed in claim 14 wherein the bank comprises interconnects having a neighbour interconnect located within a predetermined distance.

17. A method of reducing the amount of data in a layout data structure having interconnects identified by coordinates in the layout data structure comprising the steps of:
   a. assigning a unique address location to each interconnect within the layout data structure;
   b. using the unique address locations to detect banks of interconnects within the layout data structure;
   c. selecting locations within one of the banks where one of the interconnects will be flagged;
   d. sequentially identifying the location of each interconnect in the layout data structure;
   e. flagging the interconnects located in the locations; and
   f. deleting the flagged interconnects from the layout data structure.

18. The method as claimed in claim 17 wherein outer edges of the bank are determined.

19. The method as claimed in claim 18 wherein the selected locations border the outer edges of the bank.

20. The method as claimed in claim 17 wherein the selected locations have interconnects on all sides.

21. The method as claimed in claim 17 wherein the selected locations interconnects in predetermined rows.

22. The method as claimed in claim 21 wherein the predetermined rows are vertical, horizontal and/or diagonal.

23. The method as claimed in claim 17 wherein the unique address location comprises bitwise interleaved x, y coordinates.

24. The method as claimed in claim 17 wherein the bank comprises the interconnects having a neighbour interconnect located within a predetermined distance.

25. method of reducing the amount of data in a layout data structure comprising the steps of:
   a. assigning a unique address location to each interconnect within the layout data structure;
   b. detecting a bank of interconnects within the layout data structure, using the unique addresses, each interconnect in the bank being commonly electrically connected at an input and an output thereof; and
   c. deleting a plurality of the interconnects from the layout data structure of the detected bank, leaving sufficient interconnects to maintain electrical connectivity and visual representation of said bank of interconnects.

26. The method as claimed in claim 25 further comprising the steps of:
   d. repeating steps b. and c. for all subsequent bank of interconnects within the layout data structure.

27. The method as claimed in claim 26 wherein the unique address location comprises bitwise interleaved x, y coordinates.

28. The method as claimed in claim 26 wherein the bank comprises interconnects having a neighbour interconnect located within a predetermined distance.

29. An apparatus for reducing an amount of data in a layout data structure for an integrated circuit (IC) comprising:
   means for identifying interconnects within the layout data structure;
   means for detecting a bank of the interconnects, each interconnect in the bank being commonly electrically connected at an input and an output thereof;
   means for identifying selected interconnects located within the banks in accordance with a predetermined criteria; and
   means for deleting the identified selected interconnects from the layout data structure.

30. The apparatus as claimed in claim 29 wherein the predetermined criteria is determined as a function of the interconnects required to maintain the electrical connectivity and visual representation of the bank.

31. The apparatus as claimed in claim 29 wherein the location of each interconnect in the layout data structure is identified by x and y coordinates and the apparatus further includes means for assigning a unique address location to each interconnect within a layout.

32. The apparatus as claimed in claim 31 comprising means for bitwise interleaving the x and y coordinates to form the unique address location.

33. The apparatus as claimed in claim 32 comprising means sorting the unique address locations to define the bank of interconnects.

34. An apparatus for reducing the amount of data in a layout data structure comprising:
   means for assigning a unique address location to each interconnect within the layout data structure;
   means for detecting a bank of interconnects within the layout data structure using the unique address locations, each interconnect in the bank being commonly electrically connected at an input and an output thereof; and
   means for replacing all the interconnects within the detected bank with a single large interconnect.

35. The apparatus as claimed in claim 34 comprising means for bitwise interleaving x, y coordinates of interconnects to produce the unique address locations.

36. An apparatus for reducing the amount of data in a layout data structure having interconnects identified by coordinates in the layout data structure comprising:
   means for assigning a unique address location to each interconnect within the layout data structure;
   means for using the unique address locations to detect a bank of interconnects within the layout data structure;
   means for selecting locations within the bank where an interconnect will be flagged;
   means for sequentially identifying the location of each interconnect in the layout data structure;

means for flagging the interconnects located in the predetermined locations; and means for deleting the flagged interconnects from the layout data structure.

37. The apparatus as claimed in claim 36 comprising means for bitwise interleaving x, y coordinates of interconnects to produce the unique address locations.

38. An apparatus for reducing the amount of data in a layout data structure comprising:

means for assigning a unique address location to each interconnect within the layout data structure;

means for detecting a bank of interconnects within the layout data structure using the unique address locations, each interconnect in the bank being commonly electrically connected at an input and an output thereof; and means for deleting a plurality of the interconnects from the layout data structure of the detected bank, leaving sufficient interconnects to maintain electrical connectivity and visual representation of said bank of interconnects.

39. The apparatus as claimed in claim 38 comprising means for bitwise interleaving x, y coordinates of interconnects to produce the unique address locations.

* * * * *

UNITED STATES PATENT AND TRADEMARK OFFICE
CERTIFICATE OF CORRECTION

PATENT NO. : 7,278,121 B2  Page 1 of 1
APPLICATION NO. : 10/922982
DATED : October 2, 2007
INVENTOR(S) : Aitnouri et al.

It is certified that error appears in the above-identified patent and that said Letters Patent is hereby corrected as shown below:

Column 5, line 27:
 "x3y3x2" should be --x3y3x2y2x1y1x0y0--.
Column 6, claim 3, line 45;
 "the visual" should be --a visual--.
Column 8, claim 36, lines 62-63;
 "a bank" should be --banks--.
Column 8, claim 36, line 64;
 "the bank" should be --each bank--.

Signed and Sealed this

Twenty Second Day of April, 2008

JON W. DUDAS
*Director of the United States Patent and Trademark Office*